(12) United States Patent
Mozdzen et al.

(10) Patent No.: US 6,266,793 B1
(45) Date of Patent: Jul. 24, 2001

(54) JTAG BOUNDARY SCAN CELL WITH ENHANCED TESTABILITY FEATURE

(75) Inventors: Thomas J. Mozdzen, Gilbert; Orlando Davila, Queen Creek; Christopher P. McAllister, Chandler, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/258,656

(22) Filed: Feb. 26, 1999

(51) Int. Cl.[7] .................................................. G01R 31/28
(52) U.S. Cl. ............................................ 714/727; 714/734
(58) Field of Search .................................... 714/727, 726, 714/733, 734, 30, 37

(56) References Cited

U.S. PATENT DOCUMENTS

| | | | |
|---|---|---|---|
| 5,029,166 | 7/1991 | Jarwala et al. | 371/22.1 |
| 5,319,646 * | 6/1994 | Simpson et al. | 714/727 |
| 5,333,139 | 7/1994 | Sturges | 371/22.3 |
| 5,377,198 | 12/1994 | Simpson et al. | 371/22.3 |
| 5,377,199 | 12/1994 | Fandrich | 371/22.3 |
| 5,428,624 | 6/1995 | Blair et al. | 371/22.3 |
| 5,434,804 | 7/1995 | Bock et al. | 364/579 |
| 5,448,525 | 9/1995 | Sturges | 365/281 |
| 5,479,652 | 12/1995 | Dreyer et al. | 395/183.06 |
| 5,491,666 | 2/1996 | Sturges | 365/201 |
| 5,497,378 * | 3/1996 | Amini et al. | 714/727 |
| 5,537,536 | 7/1996 | Groves | 395/183.04 |
| 5,596,734 | 1/1997 | Ferra | 395/825 |
| 5,598,421 | 1/1997 | Tran et al. | 371/22.3 |
| 5,608,736 | 3/1997 | Bradford et al. | 371/22.3 |
| 5,768,289 | 6/1998 | James | 714/727 |
| 5,828,827 | 10/1998 | Mateja et al. | 395/183.06 |
| 5,847,561 * | 12/1998 | Whetsel | 324/158.1 |
| 5,848,235 | 12/1998 | Scott et al. | 714/726 |
| 5,852,617 | 12/1998 | Mote, Jr. | 714/726 |
| 5,862,152 | 1/1999 | Handly et al. | 714/727 |

* cited by examiner

*Primary Examiner*—Christine T. Tu
(74) *Attorney, Agent, or Firm*—Blakely, Sokoloff, Taylor & Zafman LLP

(57) ABSTRACT

A boundary scan cell for testing an integrated circuit comprises an output buffer for driving a pad of the integrated circuit, a capture register coupled to the pad through the output buffer, and an input buffer drives a signal present at the pad to a node coupled to core logic of the IC. A first multiplexer is included to have a first input coupled to the node, a second input coupled to data of a previous scan stage, and an output coupled to the capture register. Logic circuitry selectively enables/disables the input and output buffers responsive to first and second control signals such that the I/O buffers can drive the pad and, at the same time, drive the input buffer, the output of which is coupled to the input of the capture register.

15 Claims, 3 Drawing Sheets

US 6,266,793 B1

JTAG BOUNDARY SCAN CELL WITH ENHANCED TESTABILITY FEATURE

FIELD OF THE INVENTION

This invention relates to the field of integrated circuits. More specifically, the invention relates to integrated circuits that incorporate a plurality of boundary scan test circuits connected in a series-linked boundary test scan chain to permit testing of the core logic of the integrated circuit.

BACKGROUND OF THE INVENTION

Boundary scan testing is well known in the art. Boundary scan testing uses a plurality of shift registers that are built into each integrated circuit. A boundary scan controller circuit is incorporated into each integrated circuit to control the transfer of data serially from one register to another. One important advantage of boundary scan testing is that it allows testing of internal logic circuitry to be conducted from external terminals, obviating the need for probes and other instrumentation. By way of example, one primary use of boundary scan cell designs is for circuit continuity testing. This type of test involves loading a value into a register and then applying a certain voltage condition to the associated pad to determine if an open or short circuit exists.

An industry standard has been implemented for boundary scan test circuits so that integrated circuits from different manufacturers may be connected in a serial chain within an electronic system. This standard is described in an industry specification, known as the IEEE JTAG 1149.1 standard (IEEE Press, 1991) ("the Standard"). The Standard provides a protocol by which various test functions may be accomplished through specified test ports defined in the specification. For example, in a JTAG scan, test circuitry and five additional JPEG test pins are added to each chip. Essentially, the Standard outlines the details of the serial path of linked test registers (called the boundary scan register chain) through each integrated circuit. Boundary scan cell designs and architectures are described in U.S. Pat. Nos. 5,768,289; 5,491,666; 5,333,139; 5,377,199; 5,448,525; and 5,434,804, each of which are assigned to the assignee of the present application.

The Standard also defines the properties of the boundary scan controller circuit for each integrated circuit. The boundary scan controller circuit controls the transfer of data through the various stages of the shift registers formed by the boundary scan cells within the integrated circuit. During operation, a series of commands are issued through the test pins to read back data and verify that the interconnections have been properly established.

Although boundary scan circuitry has been used extensively in past microprocessor and other integrated circuit designs, the circuitry required to implement a JTAG boundary scan cell in accordance with the full IEEE specification is relatively large and complicated. There still exists a need for a minimal implementation of a JTAG boundary scan cell that provides enhanced testability features.

SUMMARY OF THE INVENTION

The present invention provides a minimal implementation of a boundary scan cell useful in capturing core data as well as the function of driving scan cell information out an I/O pad.

In one embodiment, the invention provides a boundary scan cell for testing an integrated circuit (IC) comprising an output buffer for driving a pad of the IC, and a capture register coupled to the pad through the output buffer. An input buffer drives a signal present at the pad to a node coupled to core logic of the IC. The invention also includes a first multiplexer having a first input that is coupled to the node, a second input coupled to data of a previous scan stage, and an output coupled to the capture register. A logic circuit selectively enables/disables the input and output buffers responsive to first and second control signals.

BRIEF DESCRIPTION OF THE DRAWINGS

The present invention is illustrated by way of example, and not limitation, in the figures of the accompanying drawings, where.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention.

Figure 1:
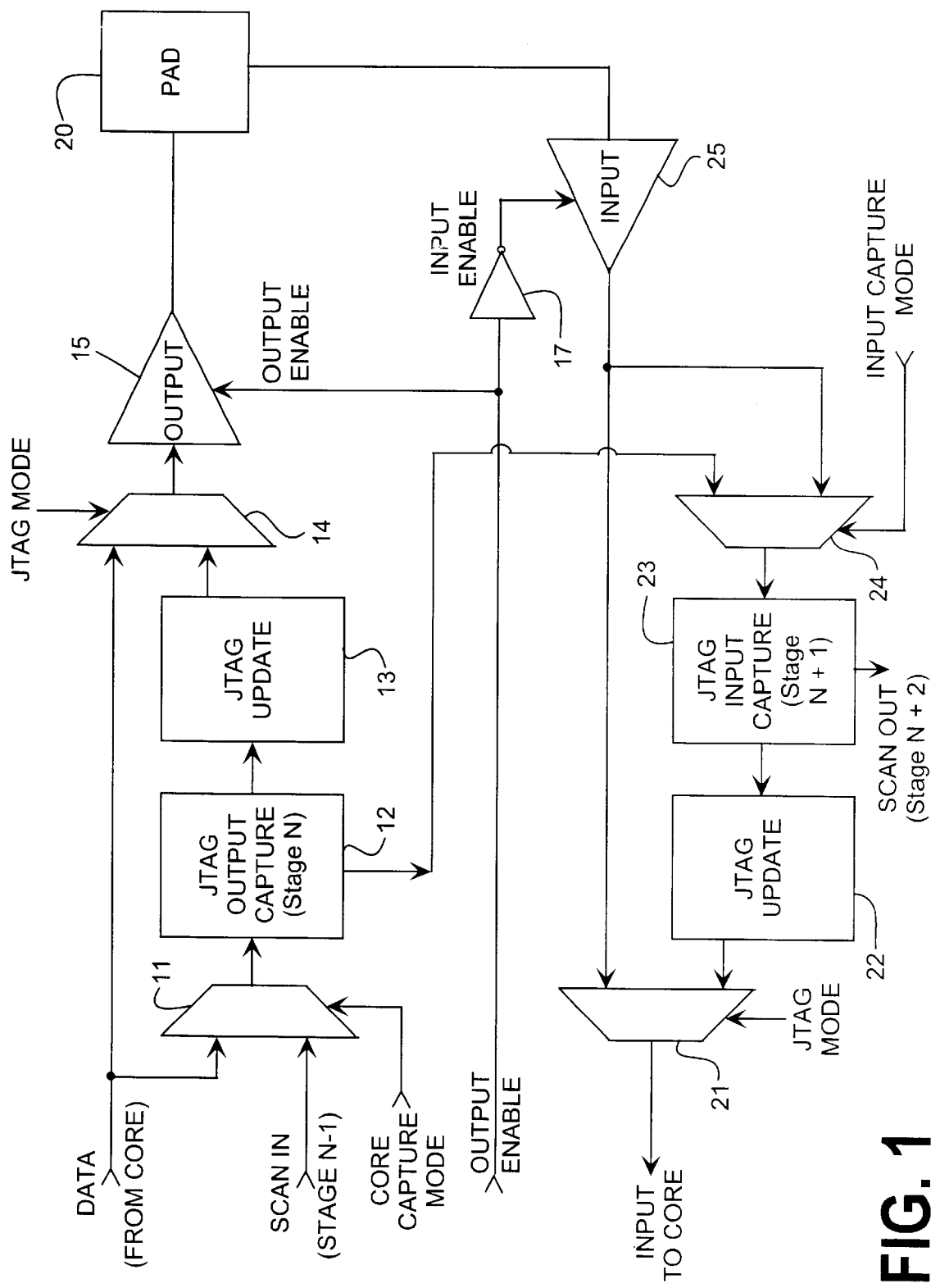
FIG. 1 is a logic schematic diagram of a prior art JTAG boundary scan cell.

One way of implementing the JTAG specification is to have a scan cell at an input/output (I/O) pad of the integrated circuit. Typically, the boundary scan cell comprises input and output buffer circuitry. In the full IEEE JTAG implementation, the boundary scan cell includes an input portion, an output portion, and a third scan cell portion to control tri-state operations. FIG. 1 is an illustration of a typical, conventional IEEE JTAG implementation. (Note that the tri-state portion is omitted).

The logic circuit in FIG. 1 includes a multiplexer 11 that selects data to be coupled to a JTAG output capture register 12 from either the core logic circuitry of the IC or from the previous scan stage (i.e., stage N-1). The selection is controlled by a core capture mode signal coupled to multiplexer 11. Practitioners in the art will appreciate that capture register 12 may either be loaded externally (from one of the five JTAG pins), or may comprise captured data from one of the previous test clock cycles.

The core capture mode signal enables either capture of data directly from the core logic that is normally provided to output buffer 15; or, if it is switched to another mode, it allows the N-1 scan stage to be input to the capture register. This latter operation typically involves shifting all of the register states of the boundary scan cells in a daisy chain fashion. The JTAG data input pin is connected to the input of the first element in the daisy chain, and the output of last element in the chain is connected to the JTAG output pin. When the JTAG circuitry is cycling in this manner, and all of the registers are filled some value, all of the values may be shifted from one stage to the next until the circuitry is in a desired position or state.

Once all shifting operations have been completed and the circuitry is in a desired state, an update register 13 (shown coupled to capture register 12) may be used to properly align and present the data to output buffer 15. Note that the output of register 13 is coupled to one of the inputs of multiplexer 14. The other input of multiplexer 14 is coupled to receive data directly from the core logic of the integrated circuit. A JTAG mode signal, which is provided from the JTAG controller, is used to select either the captured data stored in update register 13, or the core data directly, as the input to output buffer 15.

Output buffer 15 is an ordinary buffer circuit (or inverter) used to drive a data signal to pad 20. Output buffer 15 is enabled by an output enable signal line, as shown in FIG. 1. This same output enable signal line is coupled through inverter 17 to provide an input enable signal to input buffer 25. Input buffer 25 is utilized to drive the voltage signal present at pad 20 to either the core logic of the IC (via multiplexer 21), or to an input capture register 23 (via multiplexer 24).

Multiplexer 24 selects between the output of input buffer 25, or the Nth scan stage data captured in register 12. The selection is controlled by an input capture mode signal. The output of multiplexer 24 provides the input signal to JTAG input capture register 23 (representing the N+1 scan stage). The output of capture register 23 is provided to update register 22, which in turn presents the captured input data back to the core logic via multiplexer 21. As is the case with multiplexer 14, multiplexer 21 is controlled by the JTAG mode signal.

Capture register 23 typically includes a scan output that provides the N+2 scan stage data. The last element in the scan out chain is commonly coupled to one of the JTAG readout pins.

Figure 2:
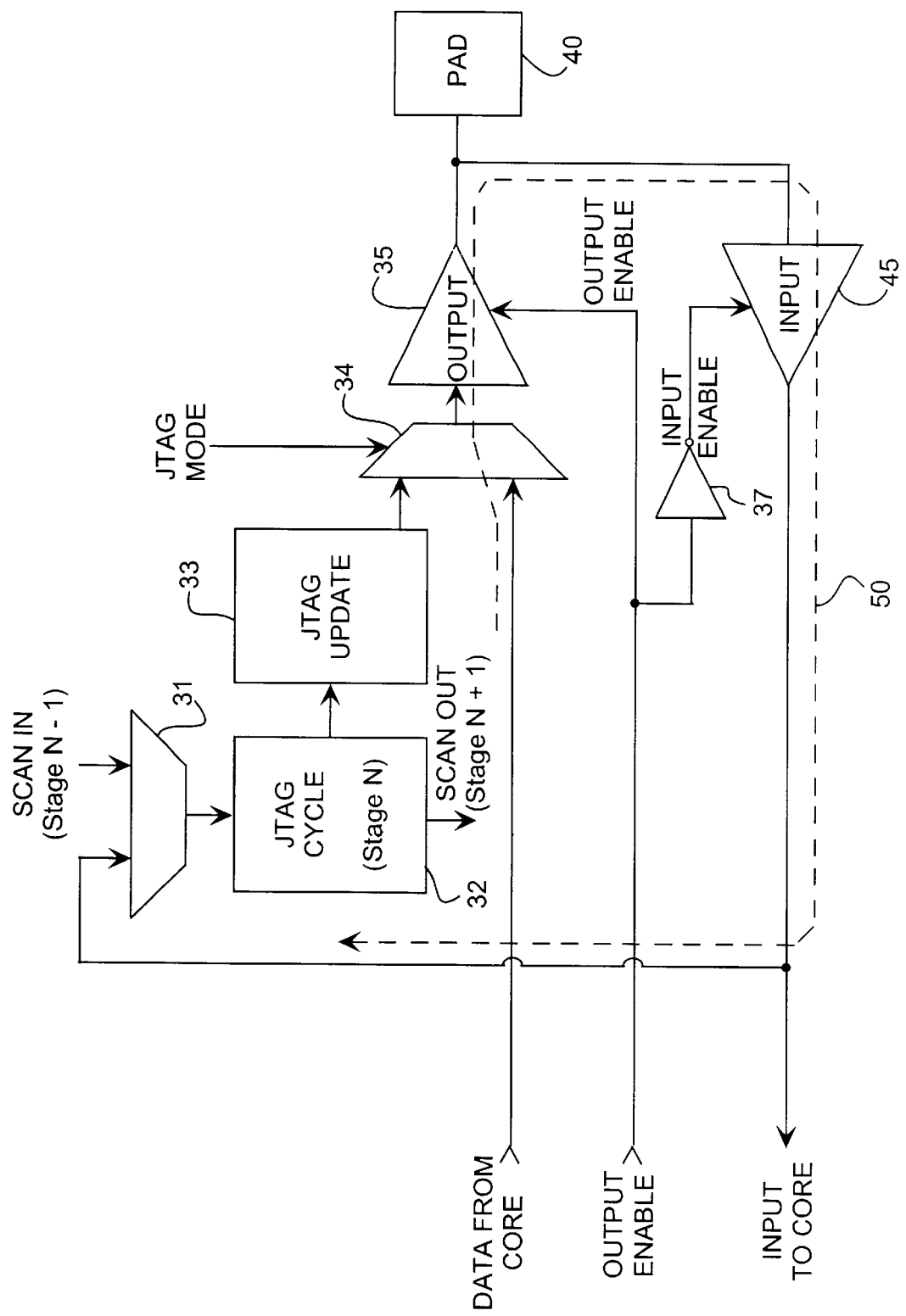
FIG. 2 is a logic schematic diagram of another prior art JTAG boundary scan cell.

With reference now to FIG. 2, there is shown another prior art implementation in which a portion of the boundary scan circuitry has been collapsed, leaving just one JTAG capture register 32. The reduced implementation of FIG. 2 includes a multiplexer 31 that provides an output to capture register 32. Multiplexer 31 selects between scan in data of a previous stage, or the output pad 40 (via input buffer 45). As is the case in the implementation of FIG. 1, the logic diagram of FIG. 2 includes an update register 33 for aligning and presenting the captured data to output buffer 35 via multiplexer 34. Multiplexer 34 selects between the captured data and the data made directly available from core logic. As before, the selection is controlled by the JTAG mode signal.

The update register 33 is controlled by a JTAG update signal that is generated by the JTAG controller. This signal basically allows the update register to capture what is presented at its input, and hold that data for the multiplexer 34 which follows in the signal path.

Output buffer 35 is enabled via an output enable signal line that is also coupled to input buffer 45 through inverter 37 ("input enable"). In this configuration, feedback path 50 is blocked whenever the output buffer 35 is driving pad 40. The reason why this is so is because the input enable signal is tri-stating input buffer 45 whenever output buffer 35 is enabled. Thus, one of the problems with the boundary scan cell circuitry of FIG. 2 is the difficulty of cycling data obtained directly from the core logic, through output buffer 35 and input buffer 45, back to the input of capture register 32.

Figure 3:
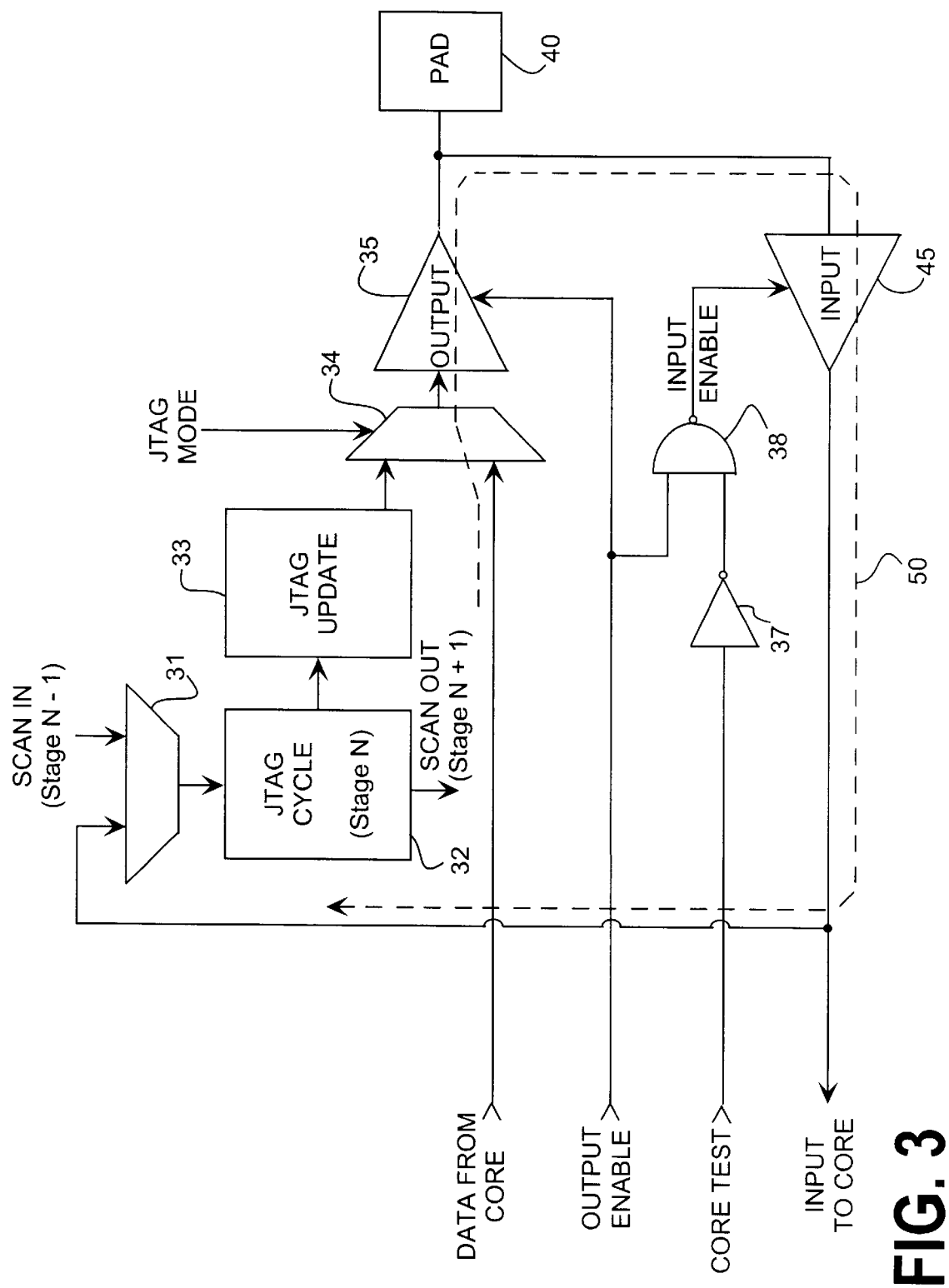
FIG. 3 is a logic schematic diagram of one embodiment of the boundary scan cell of the present invention.

FIG. 3 illustrates a logic diagram of the boundary scan cell of the present invention. The primary advantage that the invention of FIG. 3 has over previous implementations is that it allows the capture of core data with a reduced number of registers, while also enabling feedback path 50 through the use of a new signal (labeled "CORETEST" in FIG. 3). It is appreciated that the CORETEST signal may be provided in numerous ways. For instance, it may be provided through an external pin, software control, internal registers, a particular condition of the JTAG test pins, or via other control circuitry.

The invention of FIG. 3 has several advantages. First, the same boundary scan cell normally associated with each I/O pad cell of the IC may be largely reused with only the addition of a new signal and a minimal additional logic. Secondly, the boundary scan cell circuitry of FIG. 3 may be used to both drive data out of the chip for open and short circuit continuity testing, as well as capture the core data provided to the output buffers in the scan cells. Data capture may occur even when the inputs are disabled in normal operating mode.

The key to the functionality of the present invention is a special signal called "CORETEST", and the combinatorial logic represented, in one embodiment, by inverter 37 and NAND gate 38. The CORETEST signal enables the input buffer 45 and the output buffer 35 simultaneously. In a normal mode of operation, either input buffer 45 or output buffer 35 is enabled, but not both simultaneously.

To access data from the core the input enable signal is disabled; this means that the input and output buffers are both enabled at the same time. Note that when the output enable signal line is asserted high, output buffer 35 is enabled. On the other hand, when the output enable signal line is asserted low, output buffer 35 is disabled. A high voltage on the input enable signal line activates input buffer 45. In the logic diagram of FIG. 3, whenever CORETEST is asserted high, the input enable signal is high. Conversely, when CORETEST is low, then NAND gate 38 essentially functions as an inverter.

It should be understood that although the present invention has been described in conjunction with specific embodiments, numerous modifications and alterations could be made without departing from the scope of the present invention. Accordingly, the specification and drawings are to be regarded in an illustrative rather than a restrictive sense.

We claim:

1. A boundary scan cell for testing an integrated circuit (IC) comprising:

an output buffer for driving a pad of the IC;

a capture register coupled to the pad through the output buffer;

an input buffer for driving a signal present at the pad to a node coupled to core logic of the IC;

a first multiplexer having a first input coupled to the node, a second input coupled to data of a previous scan stage, and an output coupled to the capture register; and a logic circuit for selectively enabling/disabling the input and output buffers responsive to first and second control signals.

2. The boundary scan cell of claim 1 wherein the logic circuit functions such that a first state of the control signals enables a path that feeds data from the core logic, through the output and input buffers, back to the capture register.

3. The boundary scan cell of claim 2 wherein the logic circuit functions such that a second state of the control signals enables the output buffer and disables the input buffer.

4. The boundary scan cell of claim 3 wherein the logic circuit functions such that a third state of the control signals enables the input buffer and disables the output buffer.

5. The boundary scan cell of claim 2 wherein the logic circuit comprises:

an inverter having an input and an output, the input of the inverter being coupled to the first control signal;

a NAND gate having a first input coupled to the output of the inverter, a second input coupled to the second control signal, and an output coupled to an enable input of the input buffer, the second control signal also being coupled to an enable input of the output buffer.

6. The boundary scan cell of claim 1 further comprising an update register that presents data stored in the capture register to the pad.

7. The boundary scan cell of claim 6 further comprising a second multiplexer having a first input coupled to the update register, a second input coupled to the core logic, and an output coupled to the output buffer.

8. An improved boundary scan cell coupled to a pad of an integrated circuit (IC), the boundary scan cell including an input buffer and an output buffer, both coupled to the pad, the boundary scan cell also including a capture register having an input coupled to either a previous stage scan cell output, or to the pad through the input buffer, wherein the improvement comprises:

a combinatorial logic circuit coupled to the output and input buffers, the combinatorial logic circuit operating responsive to a signal to enable the input and output buffers simultaneously.

9. The improved boundary scan cell of claim 8 wherein when the signal is de-asserted, either the input or the output buffer is enabled, but not both the input and output buffers simultaneously.

10. A JTAG boundary scan cell coupled to a pad of an integrated circuit (IC) comprising:

a capture register to store data of a Nth stage, the capture register having a scan input and a scan output;

an output buffer for driving the pad of the IC;

an update register coupled to the capture register and also coupled to the pad via the output buffer;

an input buffer for driving a signal present at the pad to a node coupled to core logic of the IC;

a first multiplexer for selecting either a Nth−1 stage scan cell output or the signed present at pad as the scan input of the capture register; and a logic circuit for selectively enabling/disabling the input and output buffers responsive to first and second control signals.

11. The JTAG boundary scan cell of claim 10 wherein the logic circuit functions such that a first state of the control signals enables a path that feeds data from the core logic, through the output and input buffers, back to the capture register.

12. The JTAG boundary scan cell of claim 11 wherein the logic circuit functions such that a second state of the control signals enables the output buffer and disables the input buffer.

13. The JTAG boundary scan cell of claim 12 wherein the logic circuit functions such that a third state of the control signals enables the input buffer and disables the output buffer.

14. The JTAG boundary scan cell of claim 10 further comprising a second multiplexer having a first input coupled to the update register, a second input coupled to the core logic, and an output coupled to the output buffer.

15. The JTAG boundary scan cell of claim 10 wherein the logic circuit comprises:

an inverter having an input and an output, the input of the inverter being coupled to the first control signal;

a NAND gate having a first input coupled to the output of the inverter, a second input coupled to the second control signal, and an output coupled to an enable input of the input buffer, the second control signal also being coupled to an enable input of the output buffer.

* * * * *